United States Patent
Deguchi

(10) Patent No.: US 6,638,672 B2
(45) Date of Patent: Oct. 28, 2003

(54) EXPOSURE APPARATUS, COATING/ DEVELOPING APPARATUS, METHOD OF TRANSFERRING A SUBSTRATE, METHOD OF PRODUCING A DEVICE, SEMICONDUCTOR PRODUCTION FACTORY, AND METHOD OF MAINTAINING AN EXPOSURE APPARATUS

(75) Inventor: Nobuyoshi Deguchi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 54 days.

(21) Appl. No.: 09/864,256

(22) Filed: May 25, 2001

(65) Prior Publication Data

US 2002/0009813 A1 Jan. 24, 2002

(30) Foreign Application Priority Data

Jun. 1, 2000 (JP) ........................................ 2000-165026

(51) Int. Cl.[7] .......................... G03C 5/00; H01L 21/00; B65H 1/00
(52) U.S. Cl. .............................. 430/30; 430/494; 438/5; 414/805
(58) Field of Search ................................. 438/5; 430/30, 430/494; 118/500; 414/805; 250/492.22; 700/121

(56) References Cited

U.S. PATENT DOCUMENTS 5,997,588 A * 12/1999 Goodwin et al. .......... 29/25.01

* cited by examiner

*Primary Examiner*—Evan Pert
(74) *Attorney, Agent, or Firm*—Fitzpatrick, Cella, Harper & Scinto

(57) ABSTRACT

A photolithographic apparatus in which a light source exposes a substrate for patterning includes an enclosure having a controllable internal ambient for transferring the substrate in and out of the apparatus, a gate valve through which the substrate is transferred into or out of the enclosure, and a gas ejection unit for ejecting a gas into a region in close proximity to the gate valve, and in a direction substantially perpendicular to the direction of movement of the substrate as it is transferred into or out of the enclosure. A gas curtain is formed by the gas ejected by the gas ejection unit, such that an opening of the gate valve is shielded by the gas curtain, thereby suppressing intrusion or leakage of an ambient gas which can occur when the substrate is transferred in or out of the apparatus.

52 Claims, 13 Drawing Sheets

FIG. 11

| | |
|---|---|
| URL | http://www.maintain.co.jp/db/input.html |

TROUBLE DB INPUT

DATE OF OCCURRENCE  2000/3/15  ~404

APPARATUS TYPE  * * * * * * * * *  ~401

TITLE  OPERATION FAILURE (AT THE START)  ~403

SERIAL NUMBER OF APPARATUS  465NS4580001  ~402

DEGREE OF URGENCY  D  ~405

SYMPTOM  WHEN THE POWER OF THE APPARATUS WAS TURNED ON, AN LED BLINKED AND THE BLINKING DID NOT STOP.  ~406

WAY TO AVOID THE PROBLEM  RESTART THE APPARATUS (TURN ON THE POWER WHILE PRESSING THE RED BUTTON)  ~407

ACTION DONE  TEMPORARY FIXING HAS BEEN PERFORMED  ~408

(SEND) (RESET)

410
LINK TO THE LIST OF RESULT
SOFTWARE LIBRARY

411
SOFTWARE LIBRARY

412
OPERATION GUIDE

EXPOSURE APPARATUS, COATING/DEVELOPING APPARATUS, METHOD OF TRANSFERRING A SUBSTRATE, METHOD OF PRODUCING A DEVICE, SEMICONDUCTOR PRODUCTION FACTORY, AND METHOD OF MAINTAINING AN EXPOSURE APPARATUS

BACKGROUND OF THE INVENTION

1. Field of the Invention

The present invention relates to an exposure apparatus for exposing a wafer so as to transfer a reticle pattern onto the wafer, a coating/developing apparatus for coating a resist on a wafer and developing the resist-coated wafer, a method of transferring a substrate (e.g., a reticle, a wafer), a method of producing a device, a semiconductor production factory, and a method of maintaining an exposure apparatus.

2. Description of the Related Art

A recent trend in the exposure apparatus industry has been to reduce the wavelength of exposure light to enhance resolution, thereby allowing exposure of an even finer pattern. A fluorine ($F_2$) excimer laser is an example of a light source capable of emitting light with a short wavelength. If an exposure apparatus employs a fluorine excimer laser, however, it is necessary to purge oxygen ($O_2$) from the optical path of the exposure light to prevent a reduction in transmission of the exposure light. More specifically, it is desirable that the oxygen concentration in the path of the exposure light be less than about 1 ppm.

When a substrate such as a wafer or a reticle is transferred from a coating/developing apparatus (CD apparatus), having an ambient of atmospheric air, into an exposure apparatus, having a low-oxygen-concentration ambient such as an inert gas, the transfer is effected through a load lock chamber (LL chamber) to prevent intrusion of oxygen from the atmospheric air into the exposure apparatus. More specifically, the wafer or the reticle first is transferred from the CD apparatus into the LL chamber, which initially is filled with atmospheric air. The atmospheric air in the LL chamber then is replaced with an inert gas. After that, the wafer or the reticle is transferred into the exposure apparatus having an ambient of the inert gas.

A problem with the foregoing process is that it takes a long time to replace the atmospheric air in the LL chamber with the inert gas. Thus, the wafer or the reticle must remain in the LL chamber until the atmospheric air has been replaced. This limits throughput.

SUMMARY OF THE INVENTION

The present invention provides a technique for suppressing intrusion or leakage of an ambient gas which can occur when a substrate is carried between apparatuses such as an exposure apparatus, a coating/developing apparatus, and a load lock chamber, thereby achieving an improvement in throughput and a reduction in operating cost.

According to one aspect of the present invention, there is provided an exposure apparatus comprising an enclosure having a controllable internal ambient; a gate valve through which a substrate is transferred into or out of the enclosure; and gas ejection means for ejecting a gas into a region in close proximity to the gate valve, and in a direction substantially perpendicular to the direction of movement of the substrate as it is transferred into or out of the enclosure, wherein a gas curtain is formed by the gas ejected by the gas ejection means, such that an opening of the gate valve is shielded by the gas curtain. A stage on which a substrate such as a wafer or a reticle is placed during an exposure process may be provided within the enclosure.

According to another aspect of the present invention, there is provided a coating/developing apparatus comprising a resist coating unit for coating a resist on a wafer and a developing unit for developing the wafer. The coating/developing apparatus further comprises an enclosure in which the resist coating unit and the developing unit are disposed, the enclosure having a controllable internal environment; a gate valve through which a substrate is transferred into or out of the enclosure; and gas ejection means for ejecting a gas into a region in close proximity to the gate valve, and in a direction substantially perpendicular to the direction of movement of the substrate as it is transferred into or out of the enclosure, wherein a gas curtain is formed by the gas ejected by the gas ejection means, such that an opening of the gate valve is shielded by the gas curtain.

Preferably, the gas is ejected in a direction substantially parallel to a face of the substrate so that the substrate does not disturb the flow of the gas curtain as it passes therethrough.

Although the ejected gas may have the same composition as that of the atmospheric air, it is desirable to employ a gas having the same composition as that of the ambient gas in each chamber. More specifically, a gas having the same composition as that of a purge gas used to purge oxygen or moisture may be employed. An example is a pure inert gas such as pure nitrogen gas or pure helium gas. Use of such a gas makes it possible to create a gas curtain without causing an increase in the oxygen concentration of the ambient of the apparatus in which the gas curtain is created.

A guide may be disposed near a gas ejection unit for the gas curtain and also at the opposite end of the gas curtain to regulate the flow of the gas. This prevents mixing between the gas of the gas curtain and the ambient gas. Thus it is possible to form the gas curtain using a low-cost gas such as atmospheric air (or a gas having a higher oxygen content than the ambient gas). Even when an inert gas is used for the gas curtain, use of the guide prevents turbulent flow from occurring in the gas curtain, further enhancing the sealing capability.

In the present invention, although the gas of the gas curtain may be ejected at a constant flow rate throughout the process, it is preferable that, in order to reduce operating costs, the gas curtain be created only when necessary or that the flow rate of the gas curtain be changed as required.

In a specific example, a concentration detection means (such as a sensor, or a $F_2$ light transmission meter) is disposed to detect the concentration of oxygen or moisture in the internal ambient of an enclosure enclosing an exposure apparatus, a coating/developing apparatus, or a load lock chamber disposed between the exposure apparatus and the coating/developing apparatus. A means is disposed for turning on or off the gas curtain or continuously varying the flow rate of the gas curtain in accordance with the concentration detected by the concentration detection means.

In another specific example, a substrate detection means (such as a sensor, or means for detection by means of a sequence) is disposed to detect the presence or absence of a substrate in a region close to the gate valve, and a means is disposed for turning on or off the gas curtain or continuously varying the flow rate of the gas curtain, in response to the detection of the presence or absence of the substrate.

In the system according to the present invention, when the gate valve is opened to transfer a substrate, if a sensor detects that the substrate is being passed through the gate valve, a control signal is sent to the flow rate control means to increase the flow rate of the gas curtain, thereby preventing the intrusion of oxygen. When wafers are continuously transferred, the opening in the gate valve is sealed with the gas curtain. Otherwise, the gate valve closes when transferring is not performed for a while. This allows the gas of the gas curtain to be saved.

In the system according to the present invention described above, it is possible to transfer a wafer or a reticle into the exposure apparatus even when the environment outside the exposure apparatus includes a relatively high oxygen concentration. This reduces the time needed to replace the gas in the load lock chamber with an inert gas.

According to still another aspect of the present invention, there is provided a method of transferring a reticle or a wafer into or out of an exposure apparatus, the method comprising the steps of controlling an ambient in an enclosure; opening and closing a gate valve disposed in the enclosure; transferring the reticle or the wafer into or out of the enclosure through the gate valve; and ejecting a gas into a region in close proximity to the gate valve and in a direction substantially perpendicular to the direction of movement of the reticle or the wafer as it is transferred into or out of the enclosure, wherein a gas curtain is formed by the ejected gas, such that an opening of the gate valve is shielded by the gas curtain.

Preferably, the exposure apparatus according to the present invention further includes a display, a network interface, and a computer for executing a network software program, thereby allowing maintenance information for the exposure apparatus to be transmitted by means of data communication via a computer network. The network software program provides a user interface displayed on the display to access, via an external network, a maintenance database provided by a vendor of the exposure apparatus or by a user thereof, thereby obtaining information from the maintenance database.

According to another aspect of the present invention, there is provided a method of producing a semiconductor device, including the steps of installing, in a semiconductor production factory, a plurality of production apparatuses for performing various processes including an exposure; and producing a semiconductor device by means of a plurality of processes using the production apparatuses. The method may further include the steps of connecting the production apparatuses to each other via a local area network; and transmitting, by means of data communication, information about at least one of the production apparatuses between the local area network and an external network outside the semiconductor production factory. The method may further include the step of accessing a database provided by a vendor of the exposure apparatus or provided by a user via an external network to obtain maintenance information for the exposure apparatus or the step of performing data communication with another semiconductor production factory, thereby managing production.

According to another aspect of the present invention, there is provided a semiconductor production factory, including a plurality of production apparatuses for performing various processes, including the exposure apparatus of the present invention; a local area network for connecting the plurality of production apparatuses; and a gateway for connecting the local area network to an external network outside the factory, thereby making it possible to transmit information about at least one of the production apparatuses by means of data communication.

According to still another aspect of the present invention, there is provided a method of maintaining an exposure apparatus, including the steps of providing, by a vendor of or a user of the exposure apparatus, a maintenance database connected to an external network outside a semiconductor production factory; giving permission to access the maintenance database from the semiconductor production factory via the external network; and transmitting maintenance information stored in the maintenance database to the semiconductor production factory via the external network.

Further objects, features and advantages of the present invention will become apparent from the following description of the preferred embodiments.

BRIEF DESCRIPTION OF THE DRAWINGS

FIG. 11 is a diagram illustrating a specific example of a user interface;

DESCRIPTION OF THE PREFERRED EMBODIMENTS

First Embodiment

Figure 1:
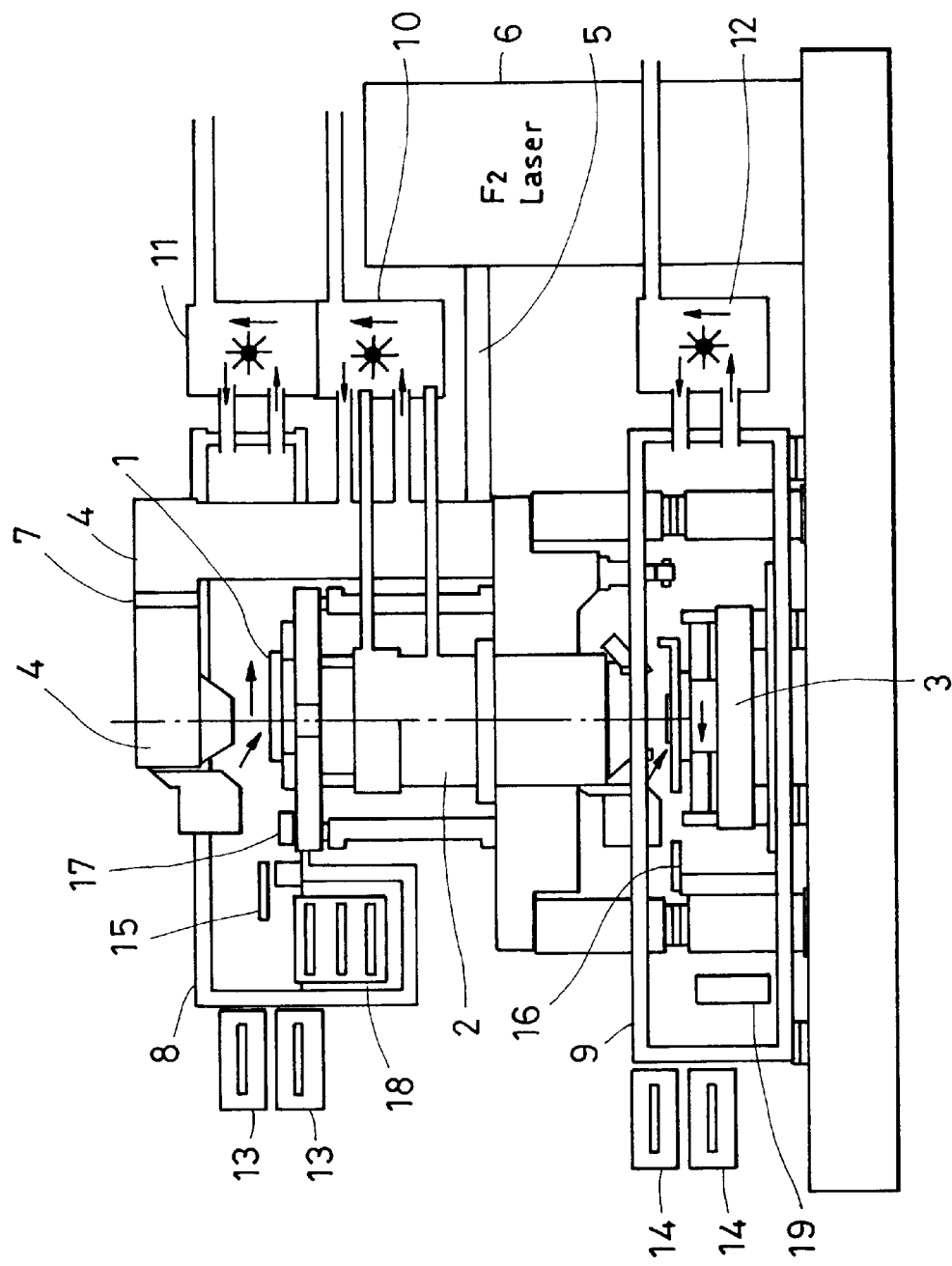
FIG. 1 is a cross-sectional view illustrating an example of a semiconductor exposure apparatus including a fluorine ($F_2$) excimer laser as a light source, according to the present invention.

FIG. 1 is a cross-sectional view illustrating an example of a semiconductor exposure apparatus including a fluorine ($F_2$) excimer laser as a light source, according to the present invention.

In FIG. 1, reference numeral 1 denotes a reticle stage on which a reticle having a pattern formed thereon is placed. Reference numeral 2 denotes a projection optical system (lens barrel) for projecting the pattern formed on the reticle onto a wafer. Reference numeral 3 denotes a wafer stage for carrying a wafer placed thereon in X, Y, Z, θ, and tilt directions. Reference numeral 4 denotes an illumination light system for illuminating the reticle with illumination light. Reference numeral 5 denotes an optical system for transmitting the light emitted from the light source to the illumination light system 4. Reference numeral 6 denotes the $F_2$ laser which serves as the light source. Reference numeral 7 denotes a masking blade for blocking exposure light so that areas on the reticle other than the pattern area are not illuminated with the exposure light. Reference numerals 8 and 9 denote enclosures for enclosing the reticle stage 1 and the wafer stage 3 and the optical path of the exposure light. Reference numeral 10 denotes a helium-conditioning apparatus for conditioning a helium (He) ambient in the lens barrel 2 and the illumination light system 4. Reference numerals 11 and 12 denote nitrogen-conditioning apparatuses for conditioning a nitrogen ($N_2$) ambient in the enclosures 8 and 9. Reference numerals 13 and 14 denote load lock (LL) chambers which are used when a reticle and a wafer are carried into the enclosures 8 and 9. Reference numerals 15 and 16 denote a reticle hand and a wafer hand, respectively, for carrying a reticle and a wafer. Reference numeral 17 denotes a reticle alignment detection system used in adjusting the position of the reticle. Reference numeral 18 denotes a reticle storage case for storing reticles in the enclosure 8. Reference numeral 19 denotes a pre-alignment unit for prealigning a wafer.

Figure 2:
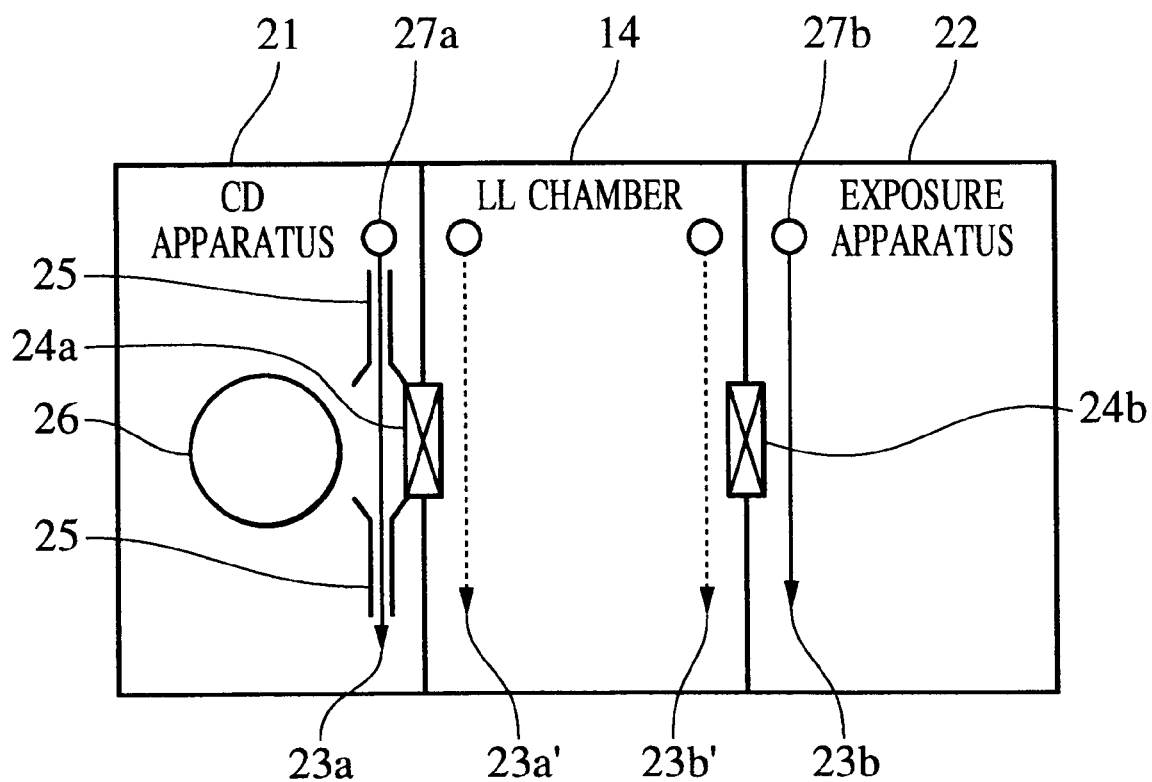
FIG. 2 is a schematic diagram illustrating an exposure apparatus and associated apparatuses according to a first embodiment of the present invention.

FIG. 2 is a schematic diagram illustrating an exposure apparatus and associated apparatuses according to one embodiment of the present invention. In FIG. 2, reference numeral 21 denotes a coating and developing (CD) apparatus including a coating apparatus for coating a resist on a wafer 26 and a developing apparatus for developing an exposed wafer. Reference numeral 22 denotes an exposure apparatus. Reference numeral 14 denotes a LL chamber used when a wafer 26 is carried between the CD apparatus 21 and the exposure apparatus 22. Reference numeral 23a denotes a gas curtain disposed between the CD apparatus 21 and the LL chamber 14. Reference numeral 23b denotes a gas curtain disposed between the LL chamber 14 and the exposure apparatus 22. Reference numeral 24a denotes a gate valve disposed between the CD apparatus 21 and the LL chamber 14. Reference numeral 24b denotes a gate valve disposed between the LL chamber 14 and the exposure apparatus 22. Reference numeral 25 denotes a guide for the gas curtain 23a.

In the present embodiment, oxygen ($O_2$) in the CD apparatus 21 is purged with an inert gas such as $N_2$ so that the concentration of oxygen in the CD apparatus is about 1%. Similarly, $O_2$ in the LL chamber 14 and $O_2$ in the exposure apparatus 22 are purged and the $O_2$ concentrations in the LL chamber 14 and the exposure apparatus 22 are controlled at about 10 ppm and 1 ppm, respectively. Although in the present embodiment, the $O_2$ concentrations in the CD apparatus 21, the LL chamber, and the exposure apparatus are controlled at about 1%, 10 ppm, and 1 ppm, respectively, the $O_2$ concentrations are not limited to those values. The allowable ranges of the $O_2$ concentrations in the respective apparatuses may be determined depending upon the effectiveness of the gas curtain in preventing disturbance of the ambient in the exposure apparatus. However, it is desirable that the $O_2$ concentration in the LL chamber be higher than that in the exposure apparatus, and the $O_2$ concentration in the CD apparatus be higher than that in the LL chamber. The flowing gas of the gas curtain 23a has the same composition of that of the atmospheric air. The flow of the gas curtain 23a is passed through a path provided by the guide 25 and circulated through a circulating system (not shown) such that the flow of the gas curtain 23a does not intrude into the CD apparatus 21. On the other hand, the main ingredient of the flowing gas of the gas curtain 23b is $N_2$, so that the flowing gas of the gas curtain 23b does not cause an increase in the concentration of $O_2$ or hydrogen ($H_2$) of the ambient in the exposure apparatus 22. The LL chamber 1 is capable of replacing the ambient such that when the wafer 26 is in the LL chamber 14 during transfer of the wafer 26 from the CD apparatus 21 into the exposure apparatus 22, the gate valves 24a and 24b at respective ends of the LL chamber 14 are closed and the internal ambient of the LL chamber 14 is replaced so as to reduce the oxygen concentration to a level that is lower than the maximum allowable value.

In the present embodiment, the gas of the gas curtain 23a or 23b is ejected through a gas ejection nozzle 27a or 27b. Although the gas of the gas curtain may be ejected at a constant flow rate throughout the operation of the apparatus, it is preferable that control means be employed to turn the gas curtain on and off or to change the flow rate thereof, in synchronization with the operation of wafer carrying means (not shown) and/or the operation of the gate valves 24a and 24b disposed between the LL chamber 14 and the respective apparatuses. A method of turning the gas curtain on and off or changing the flow rate thereof using the control means is described below with reference to FIG. 3.

Figure 3:
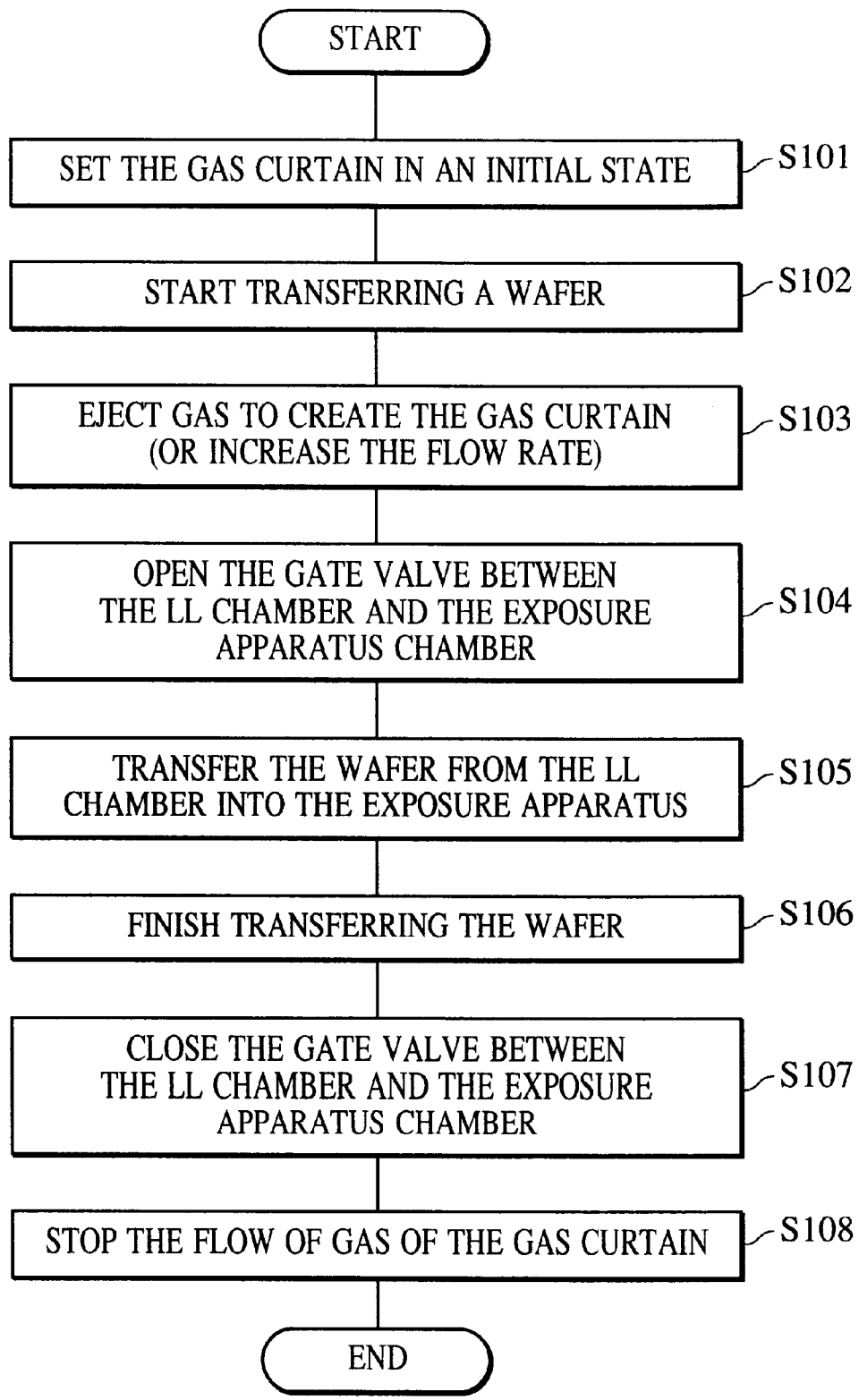
FIG. 3 is a flow chart illustrating a process of carrying a wafer into the exposure apparatus through a load lock chamber, in the system shown in FIG. 2.

FIG. 3 is a flow chart illustrating the process of carrying a wafer 26 into the exposure apparatus 22 through the LL chamber 14.

First, in the CD apparatus 21, a resist is coated on the wafer 26. The resist-coated wafer 26 then is transferred into the LL chamber 14 through the gate valve 24a. At this stage, the gate valve 24b on the side of the exposure apparatus 22 is in a closed state, and the gas curtain 23b is in an initial state in which no gas is ejected from the nozzle 27b (or a small amount of gas is ejected) (step S101). The gate valve 24a on the side of the CD apparatus 21 then is closed and transfer of the wafer 26 is started (step S102). When transfer of the wafer 26 is started in step S102, a gas curtain 23b is created. That is, gas is ejected from the nozzle 27b (or the flow rate is increased) synchronously with the start of transferring the wafer 26 (step S103). Thereafter, the gate valve 24b located between the LL chamber 14 and the exposure apparatus 22 is opened (step S104), and the wafer 26 is moved from the LL chamber 14 into the exposure apparatus 22 (step S105). In the above process, the gas of the gas curtain 23b is ejected such that the flow of gas passes by a side of the wafer 26 without striking the broad surface of the wafer 26, thereby preventing turbulent flow from occurring. After the wafer 26 has been transferred into the exposure apparatus 22 (step S106), the gate valve 24b is closed (step S107), and the ejection of the gas of the gas curtain 23b is stopped (step S108).

By turning on and off the flow of gas of the gas curtain 23b or by changing the flow rate thereof in the above-described manner, it is possible to save the inert gas and thus reduce operating costs.

Similarly, the flow of gas of the gas curtain 23a disposed in the CD apparatus 21 may be turned on and off or the flow rate thereof may be changed. In the present embodiment, because air is used as the flowing gas of the gas curtain 23a, turning the flow of the air on/off or the controlling the flow rate of the air minimizes degradation of the ambient in the CD apparatus 21.

Although, in the present embodiment, the gas curtain 23*a* is disposed in the CD apparatus 21 and the gas curtain 23*b* is disposed in the exposure apparatus 22, gas curtains may be disposed at other locations. For example, as shown by dashed lines in FIG. 2, a gas curtain 23*a*' may be disposed in the LL chamber 14, at a location on the side of the CD apparatus, instead of the gas curtain 23*a* in the CD apparatus 21. Likewise, a gas curtain 23*b*' may be disposed in the LL chamber 14, at a location on the side of the exposure apparatus, instead of the gas curtain 23*b* in the exposure apparatus 22. Furthermore, various other combinations of gas curtains are possible. For example, a combination of gas curtains 23*a* and 23*b*, a combination of gas curtains 23*a* and 23*b*', a combination of gas curtains 23*a*' and 23*b*, and a combination of gas curtains 23*a*' and 23*b*' are all possible.

Second Embodiment

Figure 4:
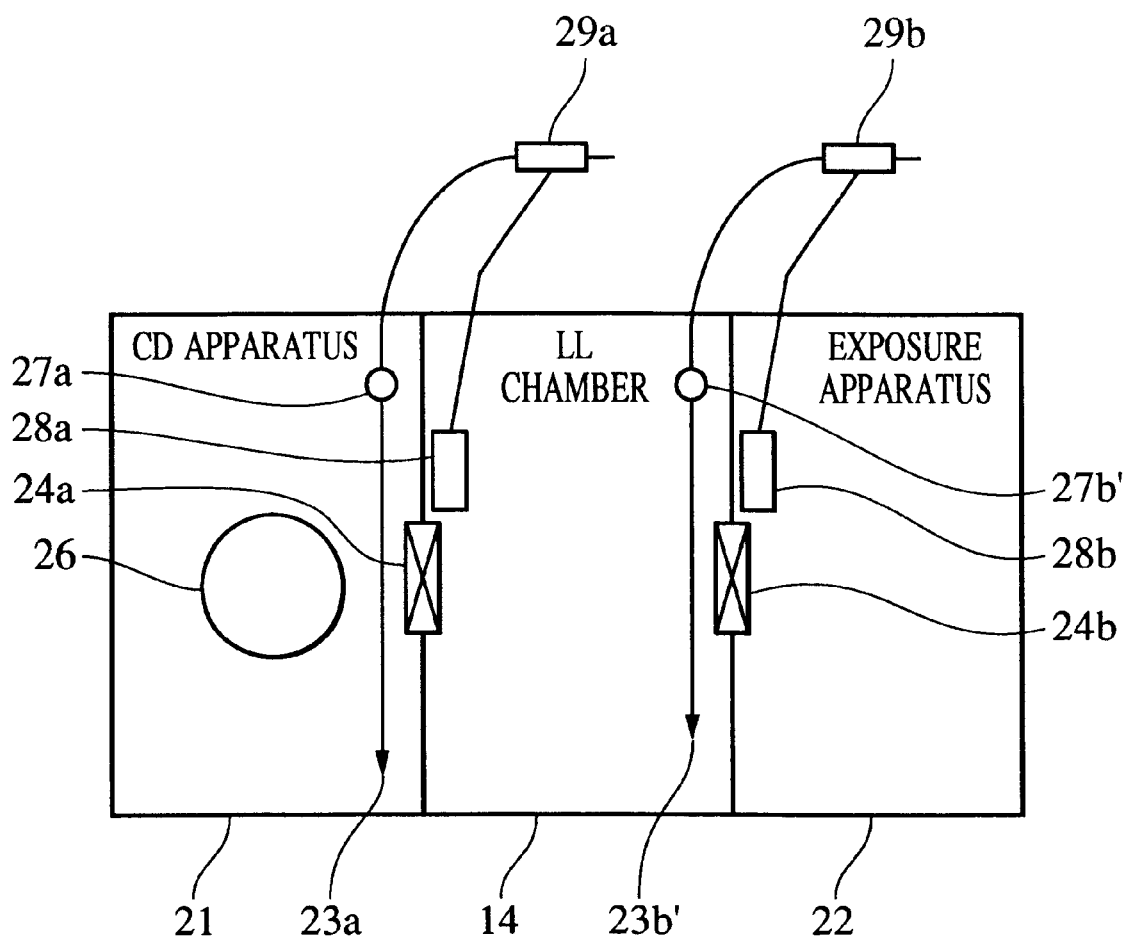
FIG. 4 is a schematic diagram illustrating an exposure apparatus and associated apparatuses according to a second embodiment of the present invention.

FIG. 4 illustrates an exposure apparatus and associated apparatuses according to a second embodiment of the present invention.

In the present embodiment, an oxygen concentration meter 28*a* for measuring oxygen concentration is disposed in a LL chamber 14. The flow rate of gas ejected from an ejection nozzle 27*a* is controlled by a flow rate controller 29*a* in accordance with the oxygen concentration in the LL chamber 14 measured by the oxygen concentration meter 28*a*. Similarly, an oxygen concentration meter 28*b* is disposed in an exposure apparatus 22, and the flow rate of gas ejected from an ejection nozzle 27*b*' is controlled by a flow rate controller 29*b* in accordance with the oxygen concentration measured in the exposure apparatus 22 by the oxygen concentration meter 28*b*. The flow rate controllers 29*a* and 29*b* are capable of continuously varying the flow rate of ejected gas and also are capable of turning on/off the flow of gas.

In the present embodiment, $N_2$ is employed as the flowing gas for both a gas curtain 23*a* and a gas curtain 23*b*'. The other components are similar to those in the first embodiment.

Figure 5:
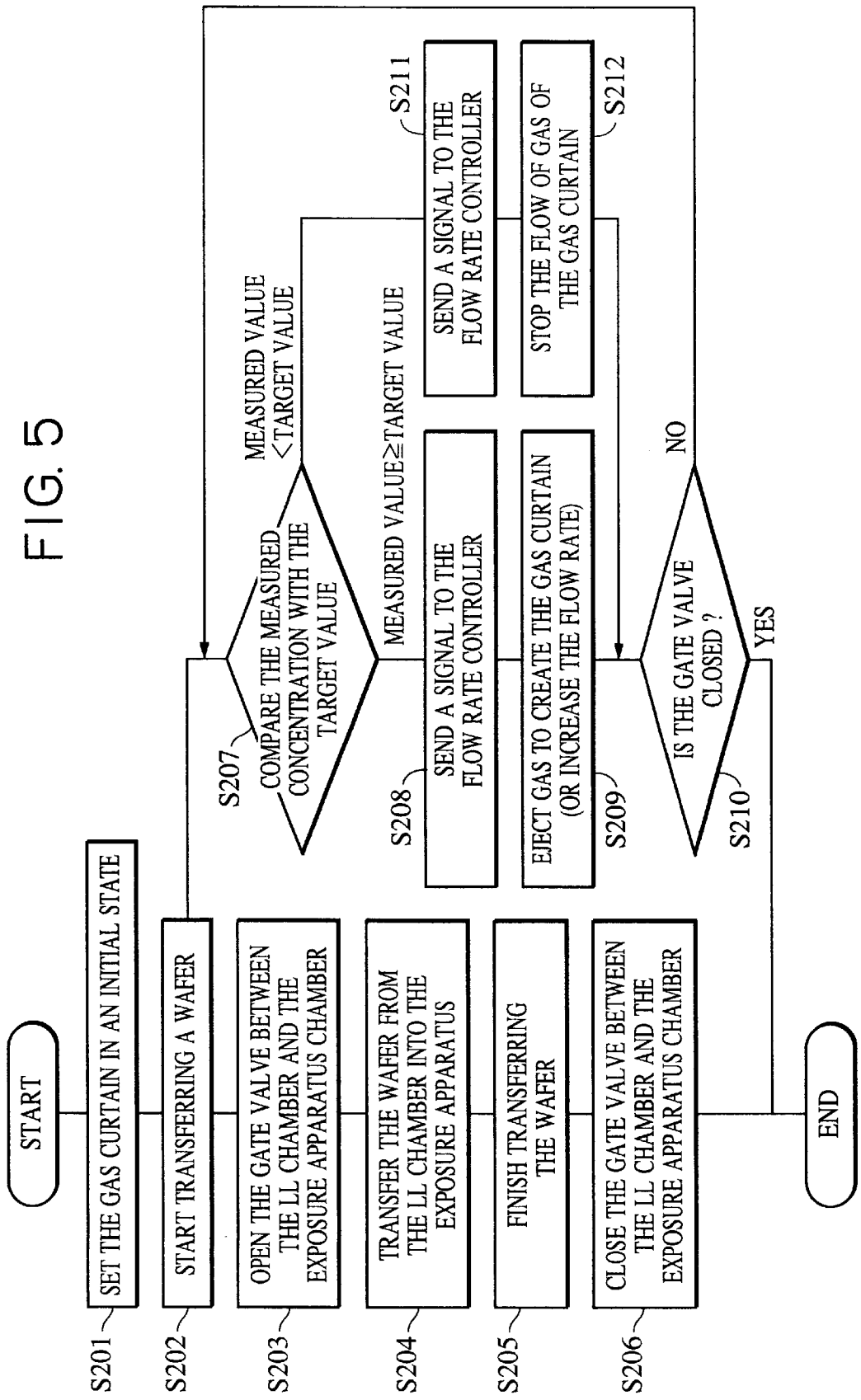
FIG. 5 is a flow chart illustrating an example of a process of carrying a wafer into the exposure apparatus through a load lock chamber, in the system shown in FIG. 4.

The process of transferring a wafer 26 into the exposure apparatus 22 through the LL chamber 14 in the system according to the present embodiment is described below with reference to FIG. 5.

First, in a CD apparatus 21, a resist is coated on the wafer 26. The resist-coated wafer 26 then is transferred into the LL chamber 14 through a gate valve 24*a*. At this stage, a gate valve 24*b* on the side of the exposure apparatus 22 is in a closed state, and the gas curtain 23*b*' is in an initial state in which no gas is ejected from the nozzle 27*b*' (or a small amount of gas is ejected) (step S201). The gate valve 24*a* on the side of the CD apparatus 21 then is closed and transfer of the wafer 26 is started (step S202).

Thereafter, the following processes are performed in a parallel fashion under the control of a control means (not shown).

In one processing flow, a gate valve 24*b* located between the LL chamber 14 and the exposure apparatus 22 is opened (step S203), and the wafer 26 is moved from the LL chamber 14 into the exposure apparatus 22 (step S204). After the wafer 26 has been transferred into the exposure apparatus 22 (step S205), the gate valve 24*b* is closed (step S206) and this processing flow is completed.

In another processing flow performed in parallel with steps 202–206 of the above-described processing flow, the flow rate of the gas curtain 23*b*' is controlled as described below.

First, the control means (not shown) reads the oxygen concentration in the exposure apparatus 22 measured by the oxygen concentration meter 28*b* and determines whether the oxygen concentration in the exposure apparatus 22 is equal to or greater than a predetermined target value (step S207). If the measured oxygen concentration is equal to or greater than the target value, the process proceeds to step S208. In step S208, the control means sends a control signal to the flow rate controller 29*b* to eject a purge gas to reduce the oxygen concentration whose current value is too high (or to increase the flow rate of the purge gas in the case where a small amount of purge gas is ejected in the initial state in step S201). In accordance with the control signal from the control means, the flow rate controller 29*b* adjusts the flow rate of the gas curtain 23*b*' (step S209). Then the process proceeds to step S210. In the case where it has been determined in step S207 that the measured oxygen concentration is lower than the predetermined target value, the process proceeds to step S211. In step S211, the control means sends a control signal to the flow rate controller 29*b* to stop ejection of the purge gas (or to reduce the flow rate of the purge gas in the case where a small amount of purge gas is ejected in the initial state in step S201), because the oxygen concentration is low enough. In accordance with the control signal from the control means, the flow rate controller 29*b* adjusts the flow rate of the gas curtain 23*b*' (step S212). The process then proceeds to step S210.

In step S210, it is determined whether the gate valve 20 24*b* is in a closed state. If the gate valve 24*b* is not closed, the process returns to step S207. However, if the gate valve 24*b* is closed, the process flow is completed.

In the present embodiment, as described above, the flow rate of the gas curtain 23*b*' is controlled such that the oxygen concentration in the exposure apparatus 22 is maintained lower than about 1 ppm.

Furthermore, in the present embodiment, the flow rate of the gas curtain 23*a* can be controlled in a similar manner when the wafer 26 is moved from the CD apparatus 21 into the LL chamber 14. In this case, the flow rate controller 29*a* increases the flow rate of the gas curtain 23*a* when the oxygen concentration in the LL chamber 14 measured by the oxygen concentration meter 28*a* exceeds about 10 ppm, thereby suppressing intrusion of oxygen into the LL chamber 14.

Third Embodiment

The system employed in this third embodiment is similar to that employed in the second embodiment (FIG. 4).

Figure 6:
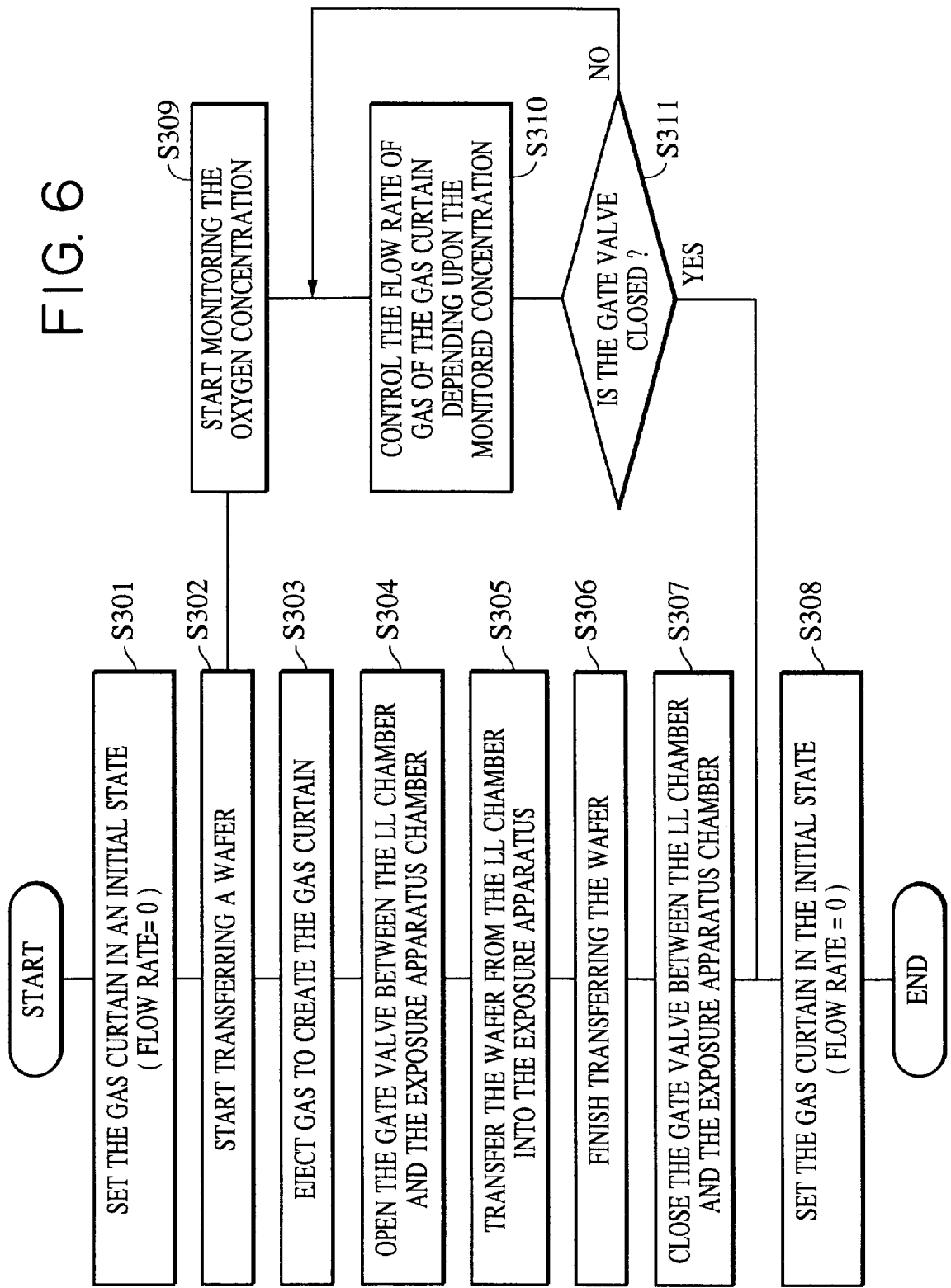
FIG. 6 is a flow chart illustrating another example of a process of carrying a wafer into the exposure apparatus through the load lock chamber, in the system shown in FIG. 4.

The process of carrying a wafer 26 into the exposure apparatus 22 through the LL chamber 14 in the system according to the present embodiment is described below with reference to FIG. 6.

First, in the CD apparatus 21, a resist is coated on the wafer 26. The resist-coated wafer 26 then is transferred into the LL chamber 14 through the gate valve 24*a*. At this stage, the gate valve 24*b* on the side of the exposure apparatus 22 is in a closed state, and the gas curtain 23*b*' is in an initial state in which no gas is ejected from the nozzle 27*b*' (step S301). The gate valve 24*a* on the side of the CD apparatus 21 then is closed and transfer of the wafer 26 is started (step S302). When transfer of the wafer 26 is started in step S302, the gas curtain 23*b*' is created. That is, gas is ejected from the nozzle 27*b*' synchronously with the start of transferring the wafer 26 (step S303). Thereafter, the gate valve 24*b* located between the LL chamber 14 and the exposure apparatus 22 is opened (step S304), and the wafer 26 is moved from the LL chamber 14 into the exposure apparatus 22 (step S305). After the wafer 26 has been transferred into the exposure apparatus 22 (step S306), the gate valve 24b is closed (step S307) and the ejection of the gas of the gas curtain 23b' is stopped (step S308). Thus, the process is completed.

At substantially the same time as the creation of the gas curtain 23b', the control means (not shown) starts to monitor the oxygen concentration in the exposure apparatus 22 measured by the oxygen concentration meter 28b (step S309). Thereafter, the control means controls the flow rate of the gas curtain 23b' using the flow rate controller 29b depending upon the oxygen concentration measured by the oxygen concentration meter 28b (step S310) in parallel with steps S303–S307. More specifically, in the present embodiment, the flow rate of the gas curtain 23b' is increased when the oxygen concentration measured by the oxygen concentration meter 28b exceeds about 1 ppm, thereby suppressing intrusion of oxygen into the exposure apparatus 22. The flow rate controller 29b determines whether the gate valve 24b is closed on the basis of a control signal from the control means (not shown) (step S311). If the gate valve 24b is closed, the flow rate controller 29b stops the operation.

In the present embodiment described above, the flow rate of the gas curtain 23b' is controlled such that the oxygen concentration in the exposure apparatus 22 is maintained at less than about 1 ppm.

Furthermore, in the present embodiment, the flow rate of the gas curtain 23a can be controlled in a similar manner when the wafer 26 is moved from the CD apparatus 21 into the LL chamber 14. In this case, the flow rate controller 29a increases the flow rate of the gas curtain 23a when the oxygen concentration in the LL chamber measured by the oxygen concentration meter 28a exceeds about 10 ppm, thereby suppressing intrusion of oxygen into the LL chamber 14.

Fourth Embodiment

Figure 7:
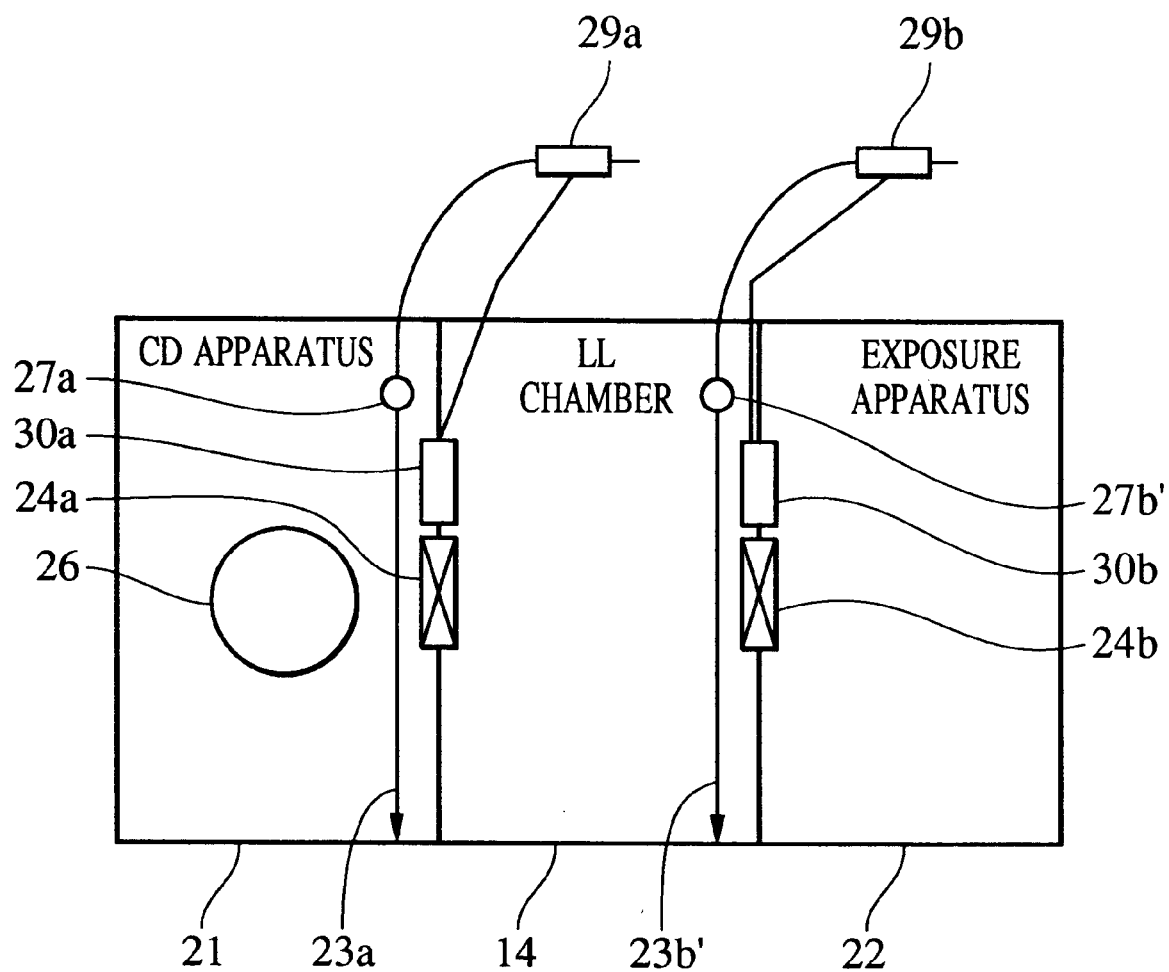
FIG. 7 is a schematic diagram illustrating an exposure apparatus and associated apparatuses according to a fourth embodiment of the present invention.

FIG. 7 illustrates an exposure apparatus and associated apparatuses according to a fourth embodiment of the present invention.

In the present embodiment, a wafer detection means 30a for detecting a wafer 26 is disposed between a CD apparatus 21 and a LL chamber 14. The flow rate of gas ejected from an ejection nozzle 27a is controlled by a flow rate controller 29a in response to the detection of the wafer 26 by the wafer detection means 30a. Similarly, a wafer detection means 30b is disposed between the LL chamber 14 and an exposure apparatus 22, and the flow rate of gas ejected from an ejection nozzle 27b' is controlled by a flow rate controller 29b in response to the detection of the wafer 26 by the wafer detection means 30b. The flow rate controllers 29a and 29b are capable of continuously varying the flow rate of ejected gas and also are capable of turning on/off the flow of gas.

In the present embodiment, $N_2$ is employed as the flowing gas for both a gas curtain 23a and a gas curtain 23b'. The other components are similar to those in the preceding embodiments.

Figure 8:
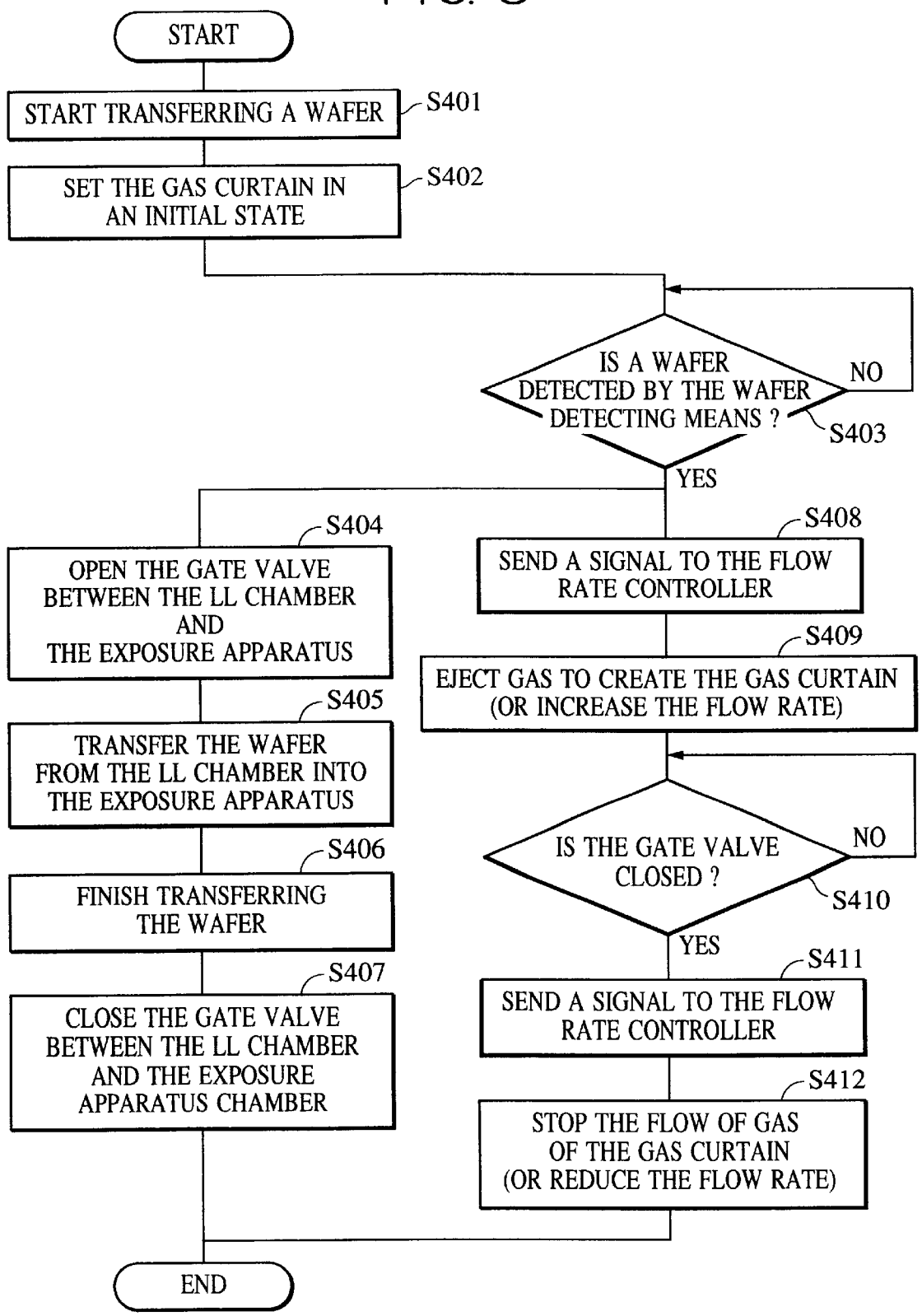
FIG. 8 is a flow chart illustrating a process of carrying a wafer into the exposure apparatus through a load lock chamber, in the system shown in FIG. 7.

The process of transferring a wafer 26 into the exposure apparatus 22 through the LL chamber 14 in the system according to the present embodiment is described below with reference to FIG. 8. When the wafer 26 is moved from the CD apparatus 21 into the LL chamber 14, a similar process is performed.

First, in the CD apparatus 21, a resist is coated on the wafer 26. The resist-coated wafer 26 then is transferred into the LL chamber 14 through a gate valve 24a. The gate valve 24a on the side of the CD apparatus 21 then is closed and transfer of the wafer 26 is started (step S401). After starting transfer of the wafer 26, a gate valve 24b on the side of the exposure apparatus 22 is maintained in the closed state, and the gas curtain 23b' is maintained in an initial state in which no gas is ejected from the nozzle 27b' (or a small amount of gas is ejected) (step S402). The gas curtain 23b' is maintained in the initial state until the wafer detection means 30b detects the wafer 26. If the wafer 26 is detected in step S403, a processing flow including steps S404–S407 and a processing flow including steps S408–S412 are performed in parallel.

In steps S404–S407, the gate valve 24b located between the LL chamber 14 and the exposure apparatus 22 is opened (step S404), and the wafer 26 is moved from the LL chamber 14 into the exposure apparatus 22 (step S405). After the wafer 26 has been transferred into the exposure apparatus 22 (step S406), the gate valve 24b is closed (step S407) and this processing flow is completed.

On the other hand, in steps S408–S412, a control means (not shown) sends a control signal to the flow rate controller 29b to eject a purge gas (or to increase the flow rate of the purge gas in the case where a small amount of purge gas is ejected in the initial state in step S402) in step S408. In accordance with the control signal from the control means, the flow rate controller 29b signals the nozzle 277 to eject the purge gas at a predetermined flow rate, thereby creating the gas curtain 23b' (step S409). This state is maintained until the gate valve 24b is closed (step S410). If it is determined in step S410 that the gate valve 24b is closed, the process proceeds to step S411. In step S411, the control means sends a control signal to the flow rate controller 29b to stop the purge gas (or to reduce the flow rate of the purge gas in the case where a small amount of purge gas is ejected in the initial state in step S402). In accordance with the control signal from the control means, the flow rate controller 29b stops or reduces the flow of the gas curtain 23b' (step S412), and the process is completed.

In the present embodiment, as described above, when the wafer detection means 30a or 30b detects the passage of the wafer 26, the flow rate of the gas curtain 23a or 23b' is increased to prevent intrusion of oxygen.

In the first through fourth embodiments described above, the system configuration and its operation are described primarily for the case where a wafer is transferred into the exposure apparatus. A similar configuration and a similar operation can be applied when a wafer is transferred from the CD apparatus into the LL chamber or when a reticle is transferred into the exposure apparatus.

In the system according to any one of the first through fourth embodiments, the ambient in the load lock chamber can be maintained substantially unchanged, and thus it is unnecessary to replace the ambient in the load lock chamber. That is, it is possible to transfer a wafer or a reticle without causing a reduction in throughput.

Semiconductor Production System Embodiment

An embodiment of a system for producing a semiconductor device (e.g., a semiconductor chip such as an IC or LSI, a liquid crystal panel, a CCD, a thin film magnetic head, a micromachine) is described below. This semiconductor device production system has the capability of providing, for example, a maintenance service for handling a malfunction of a production apparatus installed in a semiconductor production factory, scheduling maintenance thereof, and providing software, via a computer network outside the factory.

Figure 9:
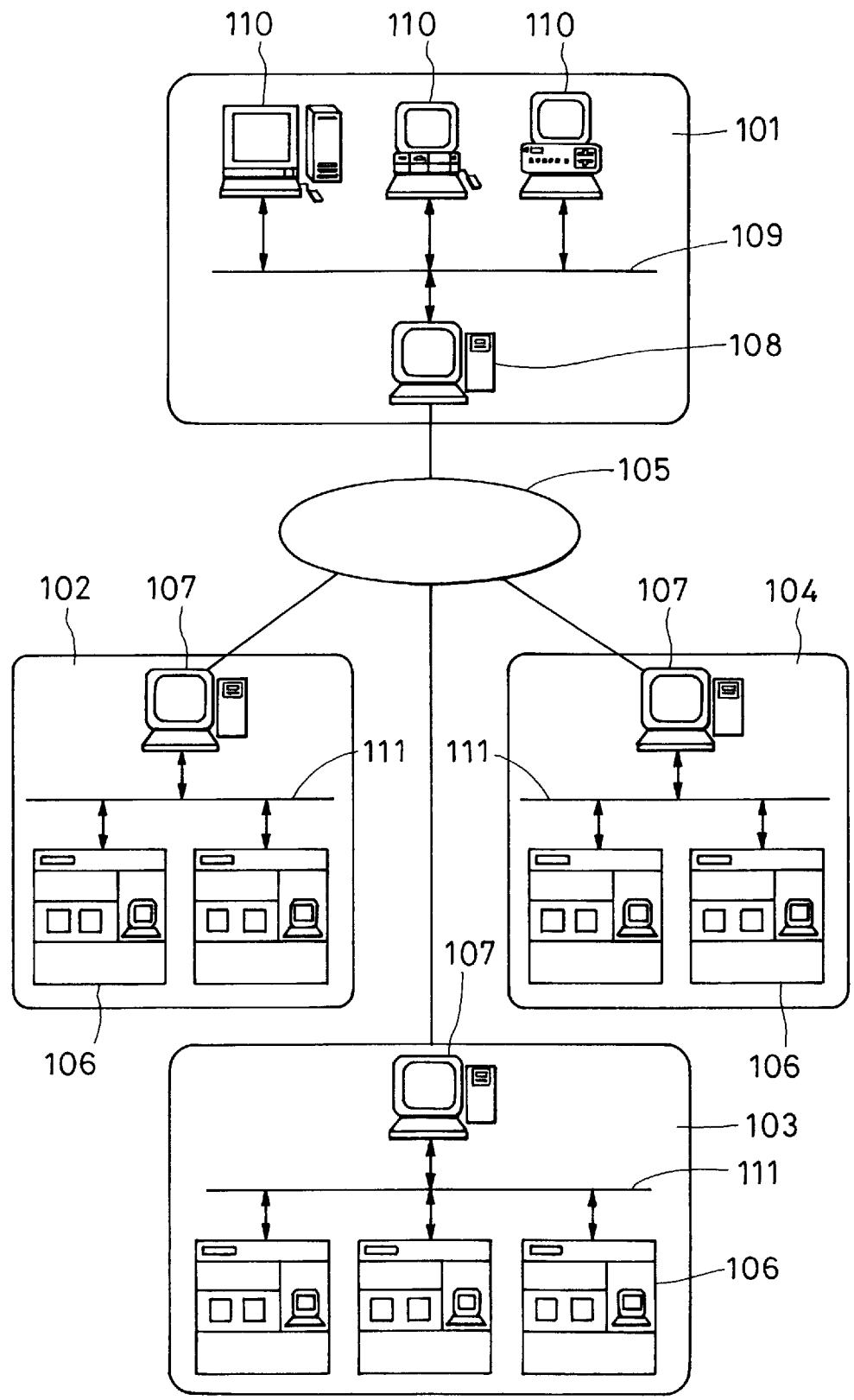
FIG. 9 is a conceptual diagram of a production system for producing a semiconductor device, seen from a certain perspective.

FIG. 9 illustrates a complete production system for producing a semiconductor device, as seen from one perspective. In FIG. 9, reference numeral 101 denotes an office of a vendor (manufacturer) of semiconductor device production apparatuses. Specific examples of production apparatuses include various types of semiconductor processing apparatuses used in semiconductor production factories such as wafer processing apparatuses (e.g., lithography apparatus such as an exposure apparatus, a resist processing apparatus, and an etching apparatus, a heat treatment apparatus, a film deposition apparatus, a planarization apparatus), assembling apparatuses, and testing apparatuses. In the office 101, there are a host management system 108 for providing a production apparatus maintenance database, a plurality of control terminals 110, and a local area network (LAN) 109 for connecting them to provide an intranet. The host management system 108 includes a gateway for connecting the LAN 109 to an external network, such as the Internet 105, and has a security capability for limiting external access to the LAN 109.

Reference numerals 102 to 104 denote factories of semiconductor manufacturers, that is, users of production apparatuses. These factories may be of different manufacturers or of the same manufacturer (for example, a wafer processing factory and an assembling factory of the same manufacturer). In each factory 102 to 104, there are production apparatuses 106, an intranet or a local area network (LAN) 111 for connecting the apparatuses 106 to one another, and a host management system 107 for managing and controlling the operations of the respective production apparatuses 106. Each of the host management systems 107 in the respective factories 102 to 104 has a gateway for connecting the LAN 111 of the factory with an external network, such as the Internet 105. The gateway makes it possible to access, via the Internet 105, the host management system 108 located in the vendor 101 from the LAN 111 in each factory. The security capability of the host management system 108 permits only authorized users to access the host management system 108. More specifically, it is possible to transmit status information indicating the status of the operation (for example, information representing a symptom of a problem or malfunction) of each production apparatus 106 from a factory to the vendor via the Internet 105. In response to the status information, the vendor may transmit to the factory response information (information indicating how to handle a problem or malfunction, including any necessary software or data) or maintenance information such as updated software or help information. Data communication between each factory 102 to 104 and the vendor 101 and also data communication within each factory via the LAN 111 may be performed using a communication protocol known as TCP/IP which is widely used in Internet communications. Instead of using the Internet for the external network, a dedicated network (such as an IDSN) may be used to achieve higher security to prevent access by unauthorized users. The host management system is not limited to that which is provided by the vendor. For example, a user may provide a host management system including a database accessible via an external network from a plurality of factories.

Figure 10:
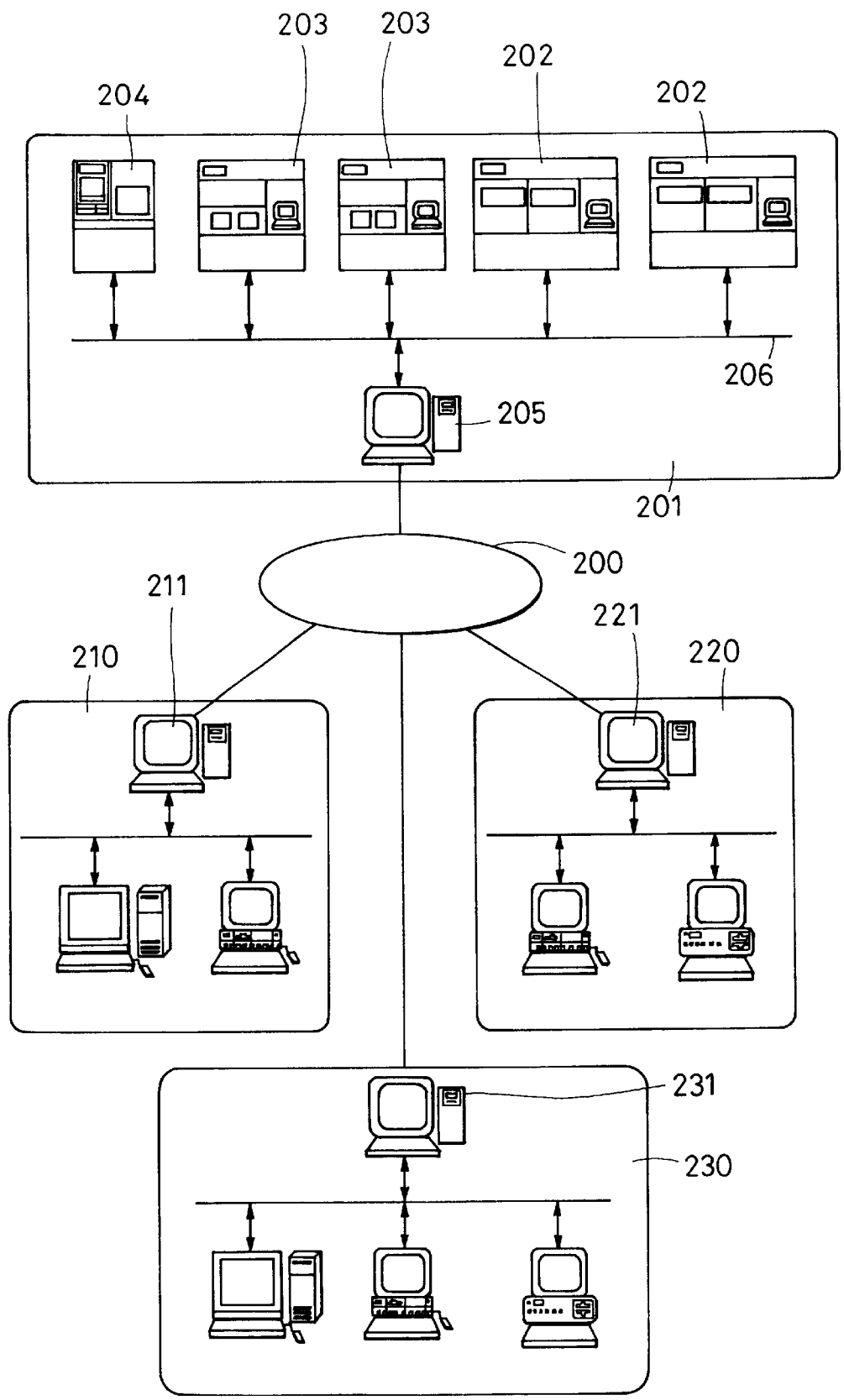
FIG. 10 is a conceptual diagram of a production system for producing a semiconductor device, seen from another perspective.

FIG. 10 is a conceptual diagram illustrating a complete production system according to the present embodiment, seen from a different perspective than that of FIG. 9. In the previous example, the system includes a plurality of user factories each including production apparatuses, and a vendor having a management system connected to each factory via an external network to manage production in each factory or transmit information about at least one production apparatus by means of data communication via the external network. In contrast, in the present example, the system includes a factory in which a plurality of production apparatuses provided by different vendors are installed, and the vendors of the production apparatuses have their own management systems connected to the factory via an external network so that maintenance information for the respective production apparatuses may be transmitted by means of data communication. In FIG. 10, reference numeral 201 denotes a factory (e.g., semiconductor device manufacturer), that is, a user of production apparatuses. The factory 201 has a production line in which there are various processing apparatuses for production. In this specific example, the production apparatuses in the factory include exposure apparatuses 202, a resist processing apparatus 203, and a film deposition apparatus 204. Although only one factory 201 is shown in FIG. 10, there can be a plurality of networked factories. The respective apparatuses within the factory are connected to each other via a LAN 206 so as to form an intranet. A host management system 205 manages the operation of the production line. On the other hand, host management systems 211, 221, and 231, for performing remote maintenance upon the factory apparatuses, are disposed in respective vendors (e.g., apparatus manufacturers) such as an exposure apparatus manufacturer 210, a resist processing apparatus manufacturer 220, and a film deposition apparatus manufacturer 230. Each host management system has a maintenance database and a gateway for connection with the external network. The host management system 205 for managing the respective apparatuses in the production factory of the user is connected to the respective management systems 211, 221, and 231 of the vendors of the apparatuses via the external network 200, which can be the Internet or a dedicated external network, for example. In this system, if a problem or malfunction occurs in one of the production apparatuses in the production line, the operation of the production line stops. The production line can recover very quickly from the problem or malfunction by receiving remote maintenance from the vendor of the apparatus having the problem or malfunction via the external network 200. Thus, it is possible to minimize the offline period of the production line.

Each production apparatus installed in the semiconductor factory has a display, a network interface, and a computer for executing network access software and apparatus control software stored in a storage device. Specific examples of storage devices include a built-in memory, a hard disk, and a network file server. The network accessing software includes a dedicated or general-purpose web browser which provides a user interface, such as that shown in FIG. 11, displayed on the display. A human operator who is responsible for managing an apparatus in the factory may input, via the user interface screen, information as to the type of the production apparatus (401), the serial number of the production apparatus (402), the title of the problem or malfunction report (403), the date of occurrence (404), the degree of urgency (405), the symptom (406), the way to avoid the problem (407), and the action done (408). The input information is transmitted to the maintenance database via the Internet. In response, maintenance information is returned from the maintenance database and displayed on the display. The web browser user interface may include hyperlinks (410 to 412), as shown in FIG. 11, for allowing the operator to obtain further detailed information of a particular item from the maintenance database, download the latest version of software to a production apparatus from a software library provided by a vendor, and read an operation guide (e.g., help information) for an apparatus.

Figure 12:
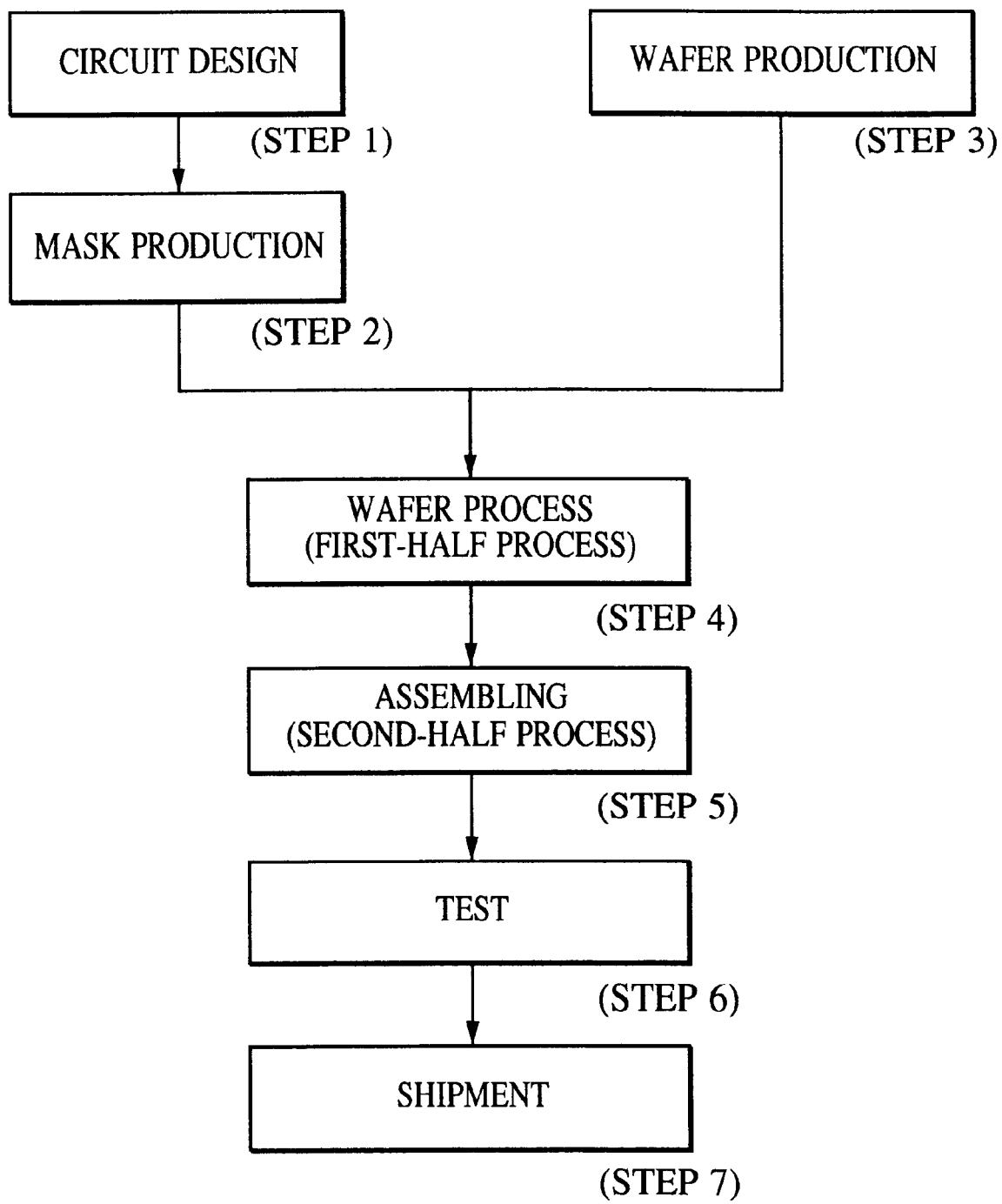
FIG. 12 is a flow chart of a device production process.

A process of producing a semiconductor device using the above-described production system is described below. FIG. 12 is a flow chart of an overall device production process. In step 1 (circuit design), a semiconductor device circuit is designed. In step 2 (mask production), masks having patterns designed in step 1 are produced. In step 3 (wafer production), a wafer is produced using silicon or the like.

In step 4 (wafer process, or often called a "first half" process), an actual circuit is formed on the wafer by means of a lithography technique using the masks and the wafer produced in the previous steps. In step 5 (assembly or often called a "second half" process), the wafer produced in step 4 is divided into chips. This step includes substeps of assembly (dicing and bonding) and packaging (chip encapsulation). In step 6 (test), the semiconductor devices produced in the previous steps are tested to conform that they operate correctly. The reliability of the devices is also evaluated in step 6. The satisfactory semiconductor devices then are shipped in step 7. Typically, the wafer process and the assembling process are performed in different factories, and the production apparatuses in each factory are maintained by the remote maintenance system described above. Furthermore, information necessary for production management and maintenance of apparatuses is transmitted by means of data communication between the wafer process factory and the assembling factory via the Internet or a dedicated network.

Figure 13:
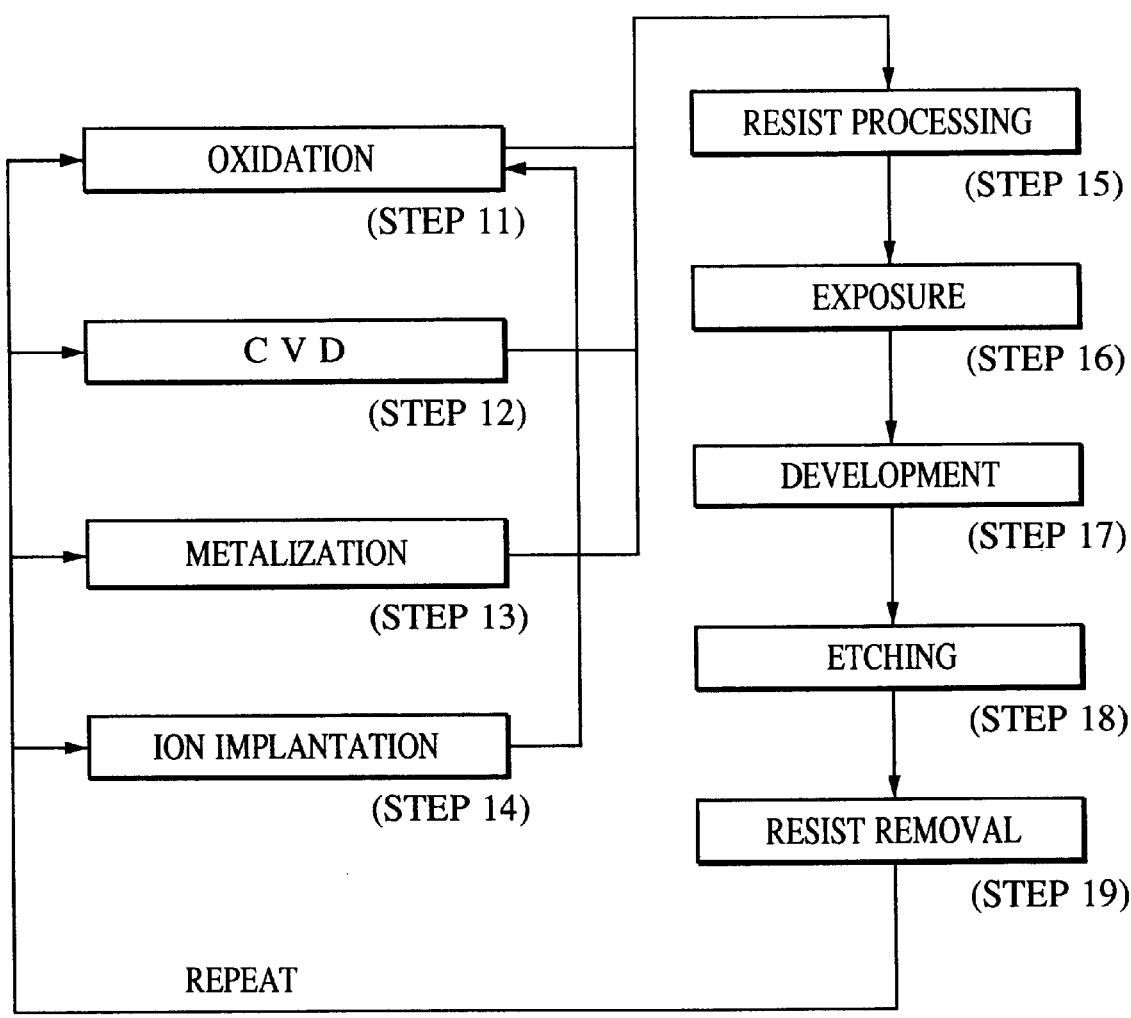
FIG. 13 is a flow chart of a wafer process.

FIG. 13 is a flowchart illustrating the details of the wafer process. In step 11 (oxidation), the surface of the wafer is oxidized. In step 12 (CVD), an insulating film is formed on the surface of the wafer. In step 13 (metalization), electrodes are formed on the surface of the wafer by means of evaporation. In step 14 (ion implantation), ions are implanted into the wafer. In step 15 (resist processing), a photosensitive material is coated on the wafer. In step 16 (exposure), a latent image of a circuit pattern formed on a mask is formed in the resist using the semiconductor exposure apparatus described above. In step 17 (development), the wafer is developed. In step 18 (etching), the surface of the wafer is partially removed except for the portions covered by the resist pattern developed in the previous step. In step 19 (resist removal), the resist, which has become no longer necessary after the etching process, is removed. The above process is performed repeatedly, thereby forming a multilevel circuit pattern on the wafer. Because the production apparatuses in each factory are maintained by the remote maintenance system described above, problems with the production apparatuses can be prevented. Even if a problem occurs in an apparatus, it is possible to quickly recover from the problem. Thus, it is possible to improve the productivity of the semiconductor device production process.

Furthermore, when a substrate is transferred into or out of the exposure apparatus or the coating/developing apparatus, transfer of the substrate is performed via the gate valves and the gas curtains formed near the gate valves so that intrusion or leakage of the ambient gas is minimized thereby allowing an improvement in throughput and a reduction in operating costs.

Except as otherwise disclosed herein, the various components shown in outline or block form in the figures are individually well known and their internal construction and operation is not critical either to the making or using of this invention or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus comprising:

a light source for exposing a substrate for patterning;

an enclosure having a controllable internal ambient;

a gate valve through which the substrate is transferred into or out of said enclosure; and gas ejection means for ejecting a gas into a region in close proximity to said gate valve, and in a direction substantially perpendicular to the direction of movement of the substrate as the substrate is transferred into or out of said enclosure, wherein a gas curtain is formed by the gas ejected by said gas ejection means, such that an opening of the gate valve is shielded by the gas curtain.

2. An exposure apparatus according to claim 1, wherein said enclosure includes a stage on which the substrate is placed.

3. An exposure apparatus according to claim 1, wherein the gas is ejected in a direction substantially parallel to a face of the substrate.

4. An exposure apparatus according to claim 1, wherein the gas has the same composition as that of atmospheric air.

5. An exposure apparatus according to claim 1, wherein the gas is an inert gas.

6. An exposure apparatus according to claim 5, wherein the inert gas is nitrogen gas or helium gas.

7. An exposure apparatus according to claim 1, further comprising a guide disposed at an end of the gas curtain near said gas ejection means, and a guide disposed at the opposite end of the gas curtain, for directing gas flow.

8. An exposure apparatus according to claim 1, further comprising concentration detection means for detecting the concentration of oxygen or moisture in the internal ambient of said enclosure, wherein the gas curtain is turned on or off in accordance with the concentration detected by said concentration detection means.

9. An exposure apparatus according to claim 1, further comprising concentration detection means for detecting the concentration of oxygen or moisture in the internal ambient of said enclosure, wherein the flow rate of the gas curtain is controlled in accordance with the concentration detected by said concentration detection means.

10. An exposure apparatus according to claim 1, further comprising substrate detection means for detecting the presence or absence of the substrate in a region close to said gate valve, wherein the gas curtain is turned on or off in response to the detection of the presence or absence of the substrate.

11. An exposure apparatus according to claim 1, further comprising substrate detection means for detecting the presence or absence of the substrate in a region close to said gate valve, wherein the flow rate of the gas curtain is controlled in response to the detection of the presence or absence of the substrate.

12. An exposure apparatus according to claim 1, wherein the substrate is a reticle having a pattern formed thereon to be transferred onto a wafer by means of exposure.

13. An exposure apparatus according to claim 1, wherein the substrate is a wafer onto which a reticle pattern is transferred by means of exposure.

14. An exposure apparatus according to claim 1, further comprising a load lock chamber, disposed outside said gate valve, for shielding the substrate from an external ambient.

15. A method of producing a device, comprising the steps of:
   installing, in a semiconductor production factory, production apparatuses for performing various processes, including an exposure apparatus according to claim 1; and
   producing a semiconductor device by means of a plurality of processes using the production apparatuses.

16. A method according to claim 15, further comprising the steps of:
   connecting the production apparatuses to each other via a local area network; and
   transmitting, by means of data communication, information about at least one of the production apparatuses between the local area network and an external network outside the semiconductor production factory.

17. A method according to claim 15, further comprising the step of accessing a database provided by a vendor of the exposure apparatus or provided by a user of the exposure apparatus via an external network to obtain maintenance information for the exposure apparatus.

18. A method according to claim 15, further comprising the step of performing data communication with another semiconductor production factory, thereby managing production.

19. A semiconductor production factory, comprising:
   a plurality of production apparatuses for performing various processes, including an exposure apparatus according to claim 1;
   a local area network for connecting said plurality of production apparatuses; and
   a gateway for connecting said local area network to an external network outside said factory,
   wherein information about at least one of said plurality of production apparatuses can be transmitted by means of data communication.

20. A method of maintaining the exposure apparatus of claim 1, the exposure apparatus being installed in a semiconductor production factory, said method comprising the steps of:
   providing, by a vendor or a user of the exposure apparatus, a maintenance database connected to an external network outside the semiconductor production factory;
   giving permission to -access the maintenance database from the semiconductor production factory via the external network; and
   transmitting the maintenance information stored in the maintenance database to the semiconductor production factory via the external network.

21. An exposure apparatus according to claim 1, further comprising:
   a display;
   a network interface; and
   a computer for executing network software,
   wherein maintenance information about said exposure apparatus is transmitted by means of data communication via a computer network.

22. An exposure apparatus according to claim 21, wherein the network software provides a user interface displayed on said display to access, via an external network, a maintenance database provided by a vendor of said exposure apparatus or by a user thereof, thereby obtaining information from the maintenance database.

23. A method of transferring a reticle into or out of an exposure apparatus that exposes a substrate to a light source through the reticle for patterning, said method comprising the steps of:
   controlling an ambient in an enclosure of the exposure apparatus;
   selectively opening and closing a gate valve disposed in the enclosure;
   transferring the reticle into or out of the enclosure through the gate valve; and
   ejecting a gas into a region in close proximity to the gate valve, and in a direction substantially perpendicular to the direction of movement of the reticle as the reticle is transferred into or out of the enclosure,
   wherein a gas curtain is formed by the ejected gas, such that an opening of the gate valve is shielded by the gas curtain.

24. A method according to claim 23, wherein the enclosure includes a stage on which a substrate to be exposed is placed.

25. A method of transferring a wafer into or out of an exposure apparatus for exposing a substrate to a light source for patterning, said method comprising the steps of:
   controlling an ambient in an enclosure;
   selectively opening and closing a gate valve disposed in the enclosure;
   transferring the wafer into or out of the enclosure through the gate valve; and
   ejecting a gas into a region in close proximity to the gate valve, and in a direction substantially perpendicular to the direction of movement of the wafer as the wafer is transferred into or out of the enclosure,
   wherein a gas curtain is formed by the ejected gas, such that an opening of the gate valve is shielded by the gas curtain.

26. A method according to claim 25, further comprising a step of exposing the wafer while the wafer is in the enclosure.

27. A coating/developing apparatus including a resist coating unit for coating a resist on a wafer, a patterning unit for exposing the wafer to a light source for patterning, and a developing unit for developing the wafer, said coating/developing apparatus comprising:
   an enclosure in which the resist coating unit and the developing unit are disposed, said enclosure having a controllable internal environment;
   a gate valve through which the wafer is transferred into or out of said enclosure; and
   gas ejection means for ejecting a gas into a region in close proximity to said gate valve, and in a direction substantially perpendicular to the direction of movement of the wafer as the wafer is transferred into or out of said enclosure,
   wherein a gas curtain is formed by the gas ejected by said gas ejection means, such that an opening of said gate valve is shielded by the gas curtain.

28. A coating/developing apparatus according to claim 27, wherein the gas is ejected in a direction substantially parallel to a face of the wafer.

29. A coating/developing apparatus according to claim 27, wherein the gas has the same composition as that of atmospheric air.

30. A coating/developing apparatus according to claim 27, wherein the gas is an inert gas.

31. A coating/developing apparatus according to claim 30, wherein the inert gas is nitrogen gas or helium gas.

32. A coating/developing apparatus according to claim 27, further comprising a guide disposed at an end of the gas curtain near said gas ejection means, and a guide disposed at the opposite end of the gas curtain, for directing the gas flow.

33. A coating/developing apparatus according to claim 27, further comprising concentration detection means for detecting the concentration of oxygen or moisture in an ambient outside said gate-valve, wherein the gas curtain is turned on or off in accordance with the concentration detected by said concentration detection means.

34. A coating/developing apparatus according to claim 27, further comprising concentration detection means for detecting the concentration of oxygen or moisture in an ambient outside said gate valve, wherein the flow rate of the gas curtain is controlled in accordance with the concentration detected by said concentration detection means.

35. A coating/developing apparatus according to claim 27, further comprising substrate detection means for detecting the presence or absence of the wafer in a region close to said gate valve, wherein the gas curtain is turned on or off in response to the detection of the presence or absence of the wafer.

36. A coating/developing apparatus according to claim 27, further comprising substrate detection means for detecting the presence or absence of the wafer in a region close to said gate valve, wherein the flow rate of the gas curtain is controlled in response to the detection of the presence or absence of the wafer.

37. A coating/developing apparatus according to claim 27, further comprising a load lock chamber, disposed outside said gate valve, for shielding the wafer from an external ambient, wherein said load lock chamber has a controllable internal ambient.

38. A photolithography apparatus comprising:
   a light source for exposing a substrate for patterning;
   a first chamber having a controllable internal ambient;
   a second chamber, adjacent to the first chamber, the second chamber having a controllable internal ambient;
   a selectively openable gate valve disposed between the first chamber and the second chamber, for permitting transfer of the substrate between the first and second chambers; and
   a gas ejection nozzle disposed in at least one of the first and second chambers, near the gate valve,
   wherein, when the gate valve is opened to transfer a substrate between the first chamber and the second chamber, the gas ejection nozzle ejects a stream of gas in a direction substantially perpendicular to the direction in which the substrate is transferred to form a gas curtain that reduces intrusion of the internal ambient of one of the first and second chambers into the other of the first and second chambers as compared to a case where no gas curtain is formed.

39. The apparatus of claim 38, wherein the internal ambient of one of the first and second chambers is controlled to have a lower oxygen concentration that the internal ambient of the other of the first and second chambers.

40. The apparatus of claim 38, wherein the first chamber is a coating/developing apparatus chamber and the second chamber is a load lock chamber.

41. The apparatus of claim 40, further comprising:
   an exposure apparatus chamber, adjacent to the load lock chamber, the exposure apparatus chamber having a controllable internal ambient;
   a second selectively openable gate valve disposed between the load lock chamber and the exposure apparatus chamber, for permitting transfer of the substrate between the load lock chamber and the exposure apparatus chamber; and
   a second gas ejection nozzle disposed in at least one of the load lock chamber and the exposure apparatus chamber, near the second gate valve,
   wherein, when the second gate valve is opened to transfer the substrate between the load lock chamber and the exposure apparatus chamber, the second gas ejection nozzle ejects a stream of gas in a direction substantially perpendicular to the direction in which the substrate is transferred to form a gas curtain that reduces intrusion of the internal ambient of one of the load lock chamber and the exposure apparatus chamber into the other of the load lock chamber and the exposure apparatus chamber as compared to a case where no gas curtain is formed.

42. The exposure apparatus of claim 41, wherein the internal ambient of the load lock chamber is controlled to have a lower oxygen concentration than the internal ambient of the coating/developing apparatus chamber, and the internal ambient of the exposure apparatus chamber is controlled to have a lower oxygen concentration than the internal ambient of the load lock chamber.

43. The apparatus of claim 38, wherein the first chamber is a load lock chamber and the second chamber is an exposure apparatus chamber.

44. The apparatus of claim 38, wherein the gas ejection nozzle is disposed in the first chamber.

45. The apparatus of claim 38, wherein the gas ejection nozzle is disposed in the second chamber.

46. The apparatus of claim 38, wherein the stream of gas is continuously ejected by the gas ejection nozzle.

47. The apparatus of claim 46, wherein the flow rate of the stream of gas ejected by the gas ejection nozzle is variable.

48. The apparatus of claim 38, wherein the gas ejection nozzle no longer ejects the stream of gas after the substrate has been transferred between the first and second chambers and the gate valve is closed.

49. A method of transferring a substrate between a first chamber of a photolithographic exposure apparatus in which the substrate is exposed to a light source for patterning and a second chamber of the photolithographic exposure apparatus through a gate valve disposed between the first and second chambers, the method comprising the steps of:
   opening the gate valve;
   transferring the substrate between the first chamber and the second chamber through the gate valve; and
   ejecting a stream of air near the opening of the gate valve, and in a direction substantially perpendicular to the direction in which the substrate is transferred, to form a gas curtain that reduces intrusion of an internal ambient of one of the first and second chambers into the other of the first and second chambers as compared to a case where no gas curtain is formed.

50. The method of claim 49, further comprising the step of varying the flow rate of the ejected stream of air depending on at least one of (i) whether the gate valve is open, (ii) whether the substrate is in a region close to the gate valve, and (iii) whether a concentration of oxygen in a selected one of the first and second chambers exceeds a predetermined level.

51. The method of claim 49, further comprising the step of stopping the ejection of the stream of air when at least one of the following conditions are met:

(i) the gate valve has been closed;

(ii) the substrate is not in a region close to the gate valve; and (iii) the concentration of oxygen in a selected one of the first and second chambers is below a predetermined level.

52. An exposure method comprising the steps of:

providing an enclosure having a controllable internal ambient in an exposure apparatus that performs patterning of a substrate;

transferring the substrate into or out of the enclosure using a gate valve;

ejecting, using gas ejection means, a gas into a region in close proximity to the gate valve, and in a direction substantially perpendicular to the direction of movement of the substrate as the substrate is transferred into or out of the enclosure; and forming a gas curtain by the gas ejected in said ejecting step, such that an opening of the gate valve is shielded by the gas curtain.

* * * * *

UNITED STATES PATENT AND TRADEMARK OFFICE
CERTIFICATE OF CORRECTION

PATENT NO. : 6,638,672 B2
DATED : October 28, 2003
INVENTOR(S) : Nobuyoshi Deguchi It is certified that error appears in the above-identified patent and that said Letters Patent is hereby corrected as shown below:

Column 2,
Line 50, "a $F_2$" should read -- an $F_2$ --.

Column 8,
Lines 28-29, "valve 20 24*b*" should read -- valve 24*b* --.

Column 13,
Line 18, "conform" should read -- confirm --.

Column 15,
Line 52, "-access" should read -- access --.

Column 18,
Line 25, "exposure apparatus" should read -- apparatus --.

Signed and Sealed this

Thirteenth Day of April, 2004

JON W. DUDAS
*Acting Director of the United States Patent and Trademark Office*